United States Patent [19]
Demler, Jr. et al.

[11] Patent Number: 4,867,696
[45] Date of Patent: Sep. 19, 1989

[54] LAMINATED BUS BAR WITH POWER TABS

[75] Inventors: Henry W. Demler, Jr., Lebanon, Pa.; Frank P. Dola, Hudson, Fla.; David J. Kimmel, Clearwater, Fla.; Thomas J. Sotolongo, Clearwater Beach, Fla.

[73] Assignee: AMP Incorporated, Harrisburg, Pa.

[21] Appl. No.: 219,946

[22] Filed: Jul. 15, 1988

[51] Int. Cl.$^4$ ............................................. H01R 25/16
[52] U.S. Cl. .................................... 439/212; 439/214; 174/72 B
[58] Field of Search ............... 174/72 B; 439/114, 212, 439/213, 61, 62, 65, 74, 630, 631, 214

[56] References Cited

U.S. PATENT DOCUMENTS

| | | | |
|---|---|---|---|
| 2,914,708 | 11/1959 | Edmunds | 439/212 |
| 3,349,292 | 10/1967 | Meacham | 439/213 |
| 3,434,094 | 3/1969 | Walter | 339/17 |
| 3,466,382 | 9/1969 | Rocklitz | 174/72 |
| 3,634,814 | 10/1972 | Inacker | 339/176 MP |
| 3,708,610 | 1/1973 | Kozel | 174/72 B |
| 3,725,843 | 4/1973 | Johnson | 339/19 |
| 3,827,005 | 7/1974 | Friend | 439/65 |
| 4,002,388 | 1/1977 | Menocal | 174/72 B |
| 4,236,038 | 11/1980 | Taylor | 174/72 B |
| 4,236,046 | 11/1980 | DeVries | 174/72 B |
| 4,241,381 | 12/1980 | Cobaugh | 361/413 |
| 4,358,633 | 11/1982 | Reynolds, Jr. | 174/72 B |
| 4,394,532 | 7/1983 | Aguayo | 174/72 B |
| 4,450,029 | 5/1984 | Holbert | 156/250 |
| 4,616,893 | 10/1986 | Feldman | 339/14 R |
| 4,655,518 | 4/1987 | Johnson | 339/17 LC |
| 4,755,145 | 7/1988 | Johnson et al. | 439/61 |

FOREIGN PATENT DOCUMENTS

| | | | |
|---|---|---|---|
| 28791 | 5/1981 | European Pat. Off. | 174/72 B |
| 2002928 | 9/1971 | Fed. Rep. of Germany | 174/72 B |
| 2912944 | 10/1980 | Fed. Rep. of Germany | 174/72 B |
| 2512283 | 3/1982 | France | 439/924 |

OTHER PUBLICATIONS

"Flexible Output Tabs for Laminar Buses", IBM Tech. Disclosure Bulletin, vol. 23, No. 12, May 1981.
Article Entitled "Bus Bars for PCB Applications Keyed to Design, Performance"-Jun. 1984 Issue of Electri-onics.

Primary Examiner—Gary F. Paumen
Attorney, Agent, or Firm—Robert W. Pitts

[57] ABSTRACT

A backplane connector assembly including a motherboard connector and power and signal daughterboard connectors is disclosed. The motherboard connector has a signal section and a power section. Individual signal contacts are located in the signal section of the motherboard connector. A laminated power bus is located in the power section of the motherboard connector which is on the opposite side of the daughterboard from the signal section. Each of a plurality of separate busses in the laminated power bus has tabs extending from one edge and bent at right angles relative to the bus so that the tabs extend orthogonally relative to the daughterboard. This configuration permits daughterboards having different thicknesses to be mated inserted into the same motherboard connector. The laminated power bus permits power to be delivered externally of the motherboard to the daughterboards.

20 Claims, 6 Drawing Sheets

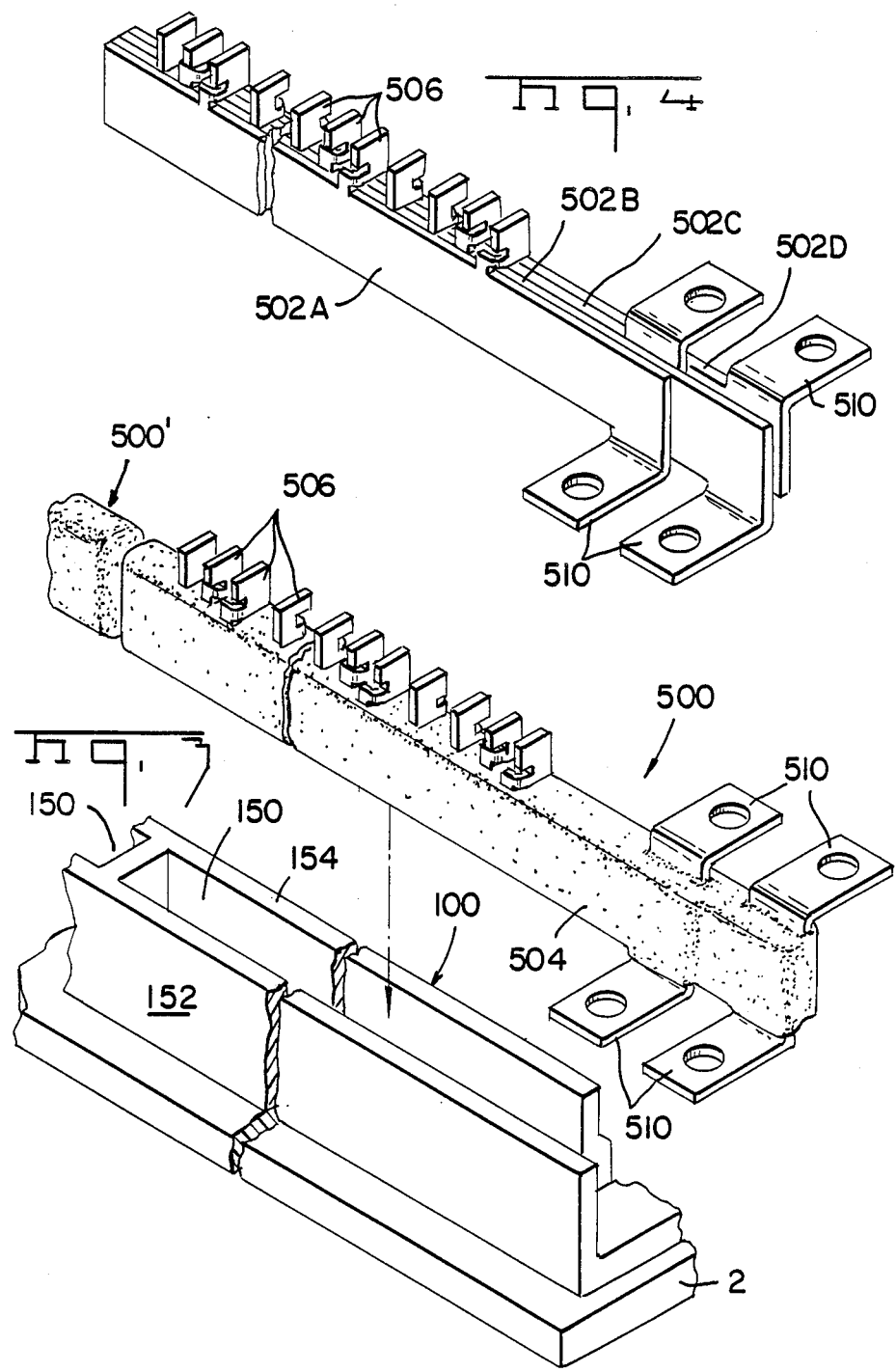

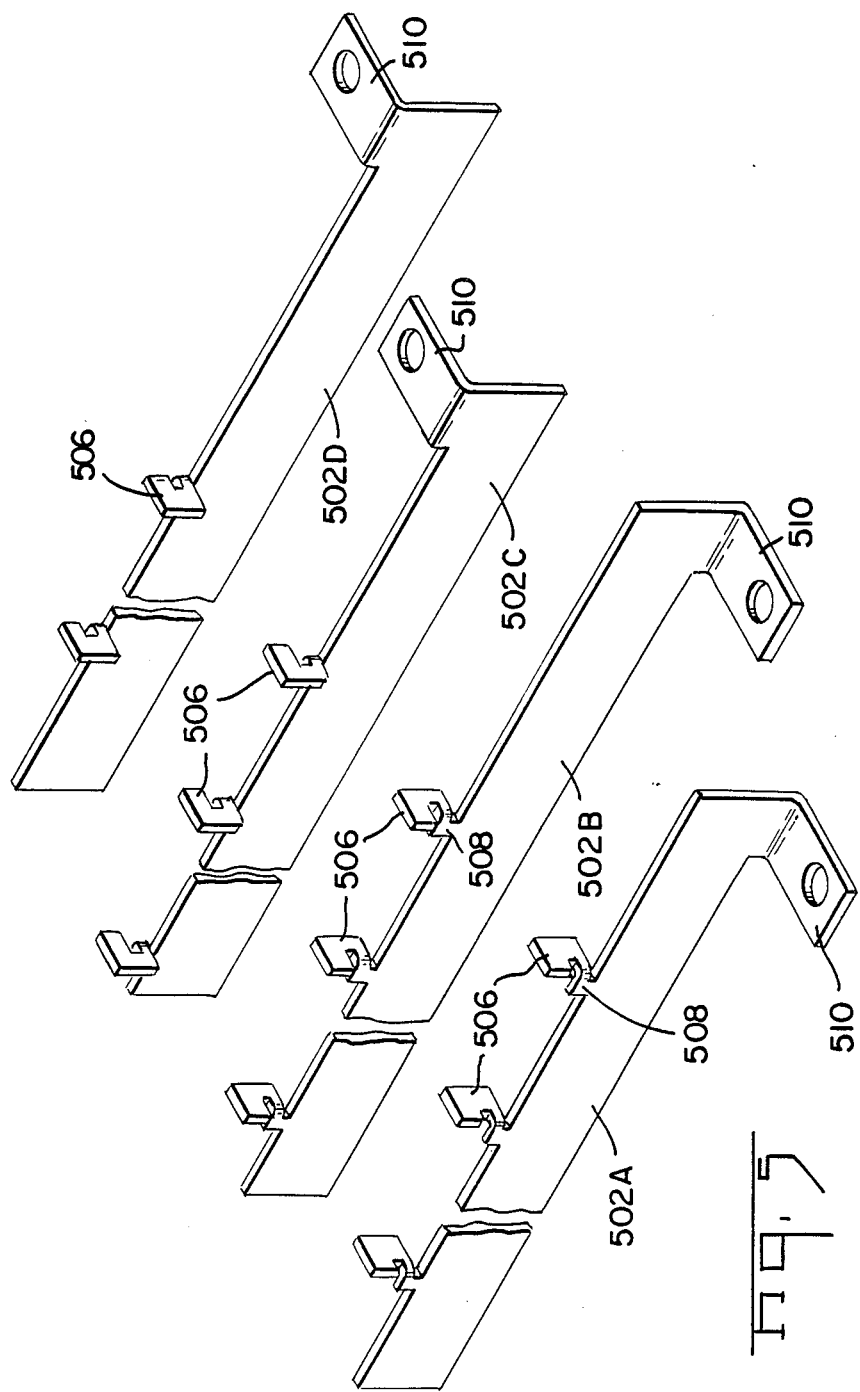

LAMINATED BUS BAR WITH POWER TABS

FIELD OF THE INVENTION

This invention relates to an electrical connector for establishing a signal and power interconnection between orthogonal printed circuit boards.

DESCRIPTION OF THE PRIOR ART

U.S. Pat. No. 4,655,518 discloses a backplane/daughterboard connector comprising two mating connector halves with mating signal pins and signal receptacles. That connector is intended to provide for the transmission of high frequency electrical signals. Ground contacts are provided adjacent the sidewalls of the housing and adjacent one of the plurality of rows of signal contacts.

The high density controlled impedance connector shown in U.S. patent application Ser. No. 096,792 filed Sept. 11, 1987, a continuation of U.S. patent application Ser. No. 866,518 filed May 23, 1986, now abandoned, discloses another connector for establishing an electrical connection between signal pins in high frequency applications. Unlike the connector shown in U.S. Pat. No. 4,655,518, the connector shown in this last mentioned application provides not only for the interconnection of a plurality of signal contacts without significant changes in impedance, but also provides a means for transmitting power between a motherboard and an orthogonal daughterboard. As the density of contacts in a backplane increases, the problem of delivering adequate power to the printed circuit board also multiplies. That problem is not addressed in U.S. Pat. No. 4,655,518. However, in the previously filed application assigned to the Assignee of the instant application, the controlled impedance for the closely spaced signals is provided for by use of a cast metal housing which provides a ground plane equally spaced from the individual pins. U.S. Pat. No. 4,655,518, which relies upon a separate ground plane, does not position the ground plane in the same fixed dimensional relationship relative to each of the signal contacts.

U.S. Pat. No. 4,616,893 discloses a connector assembly having a continuous bus bar which may be used either as a ground or as a means of delivering power. This bar is attached to a printed circuit board by through hole pins which are attached to traces on the lower surface of the printed circuit board. The bus bar does, however, provide a means for power distribution, at least partially external to the printed circuit board.

The use of external bus bars to distribute power to daughterboards in a backplane assembly is also disclosed in U.S. Pat. No. 3,725,843. The use of one or more bus bars feeding several daughterboard connectors and distribution conductors providing electrical connections between bus bars and one or more contacts on printed circuit boards is disclosed. Bus bars having integral distribution arms to make contact with the contacts on the printed circuit boards are also disclosed.

SUMMARY OF THE INVENTION

A backplane connector assembly including a motherboard connector and power and signal daughterboard connectors is disclosed. The motherboard connector has a signal section and a power section. Individual signal contacts are located in the signal section of the motherboard connector. A laminated power bus is located in the power section of the motherboard connector which is on the opposite side of the daughterboard from the signal section. Each of a plurality of separate busses in the laminated power bus has tabs extending from one edge and bent at right angles relative to the bus so that the tabs extend orthogonally relative to the daughterboard. This configuration permits daughterboards having different thicknesses to be mated inserted into the same motherboard connector. The laminated power bus permits power to be delivered externally of the motherboard to the daughterboards.

BRIEF DESCRIPTION OF THE DRAWINGS

FIG. 3 is an exploded perspective view showing the manner in which the laminated bus bar is positioned in the motherboard housing.

FIG. 4 is a view of the bus bar, the insulation having been removed.

FIG. 5 is a view of the individual bus bars.

DETAILED DESCRIPTION OF THE PREFERRED EMBODIMENT

Figure 1:
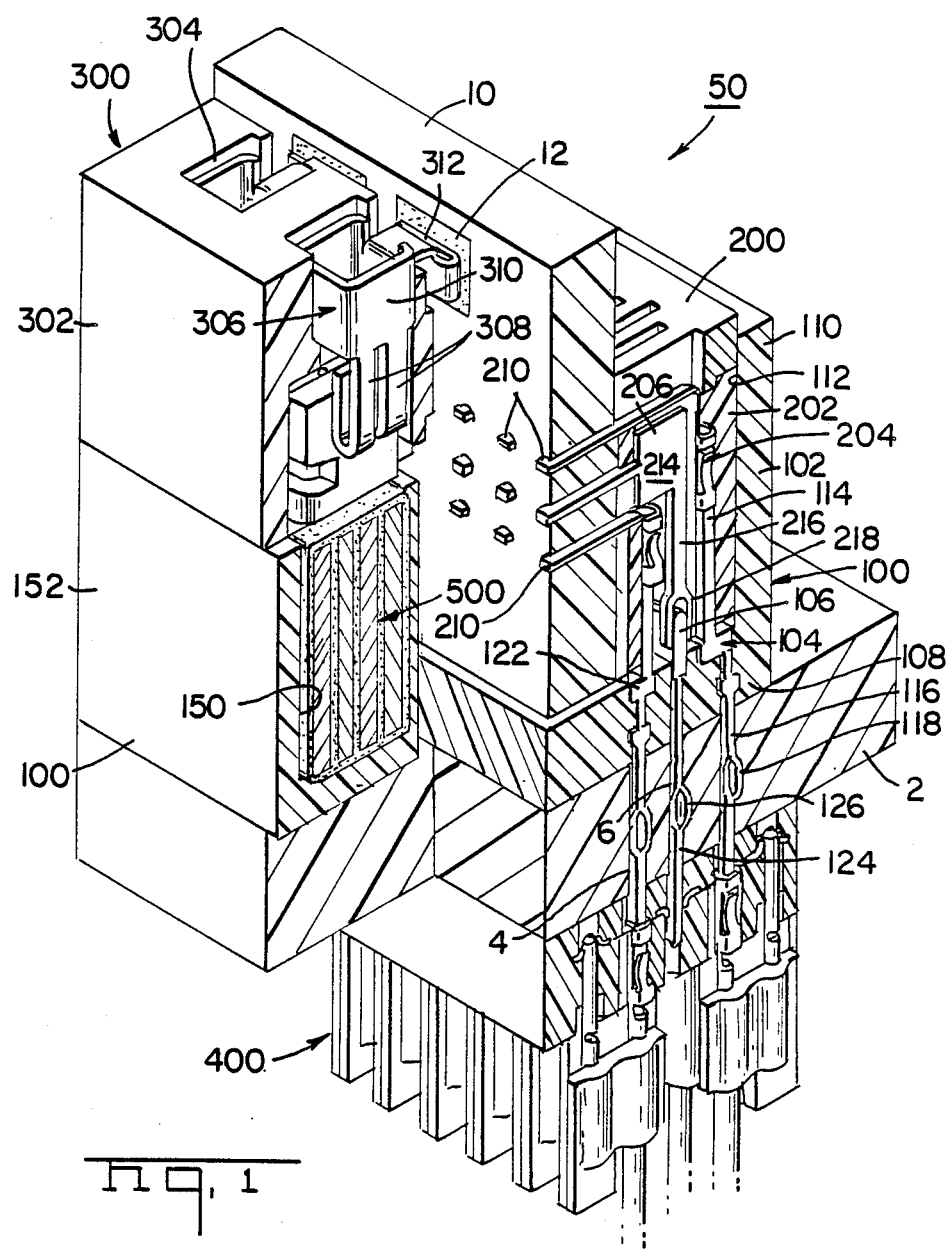
FIG. 1 is a perspective view of one embodiment of a backplane connector assembly including a motherboard backplane connector, a daughterboard signal connector, a daughterboard power connector and a coaxial input connector, all assembled to a motherboard and one daughterboard.

The backplane connector assembly comprising the preferred embodiment of this invention is intended to establish an interconnection between two orthogonal printed circuit boards employed in a backplane assembly used in a computer or similar electronic component. The connector assembly comprising the preferred embodiment of this invention is intended to interconnect both power and signal to both boards. The connector assembly includes a backplane connector assembly 50 consisting of a motherboard backplane connector 100 and daughterboard backplane signal and power, 200 and 300 respectively, connectors for making signal interconnections and for interconnecting power to both the motherboard 2 and to one or more daughterboards 10. This connector assembly is suitable for use with signal contacts spaced apart by a distance of 0.050 inch and can be employed using power contacts intended to deliver 5 amps to both the motherboard 2 and to the daughterboard 10.

A separate connector 400 can be employed to interconnect signal circuit conductors to the motherboard 2 and to the backplane signal connector used on the motherboard. The preferred embodiment of this invention employs a coaxial motherboard signal connector 400. It should be understood, however, that more conventional means of interconnecting signal conductors to the motherboard 2 can also be employed for example individual signal wires can be soldered or wire-wrapped directly to the pins employed in this assembly. In the preferred embodiment of this invention, a laminated ground bus 500 attached to the motherboard 2 and located within the motherboard backplane connector 100 can be used to deliver power to a receptacle connector 300 on the daughterboard.

Not only will the connector assembly comprising the preferred embodiment of this invention depicted herein deliver both power and signals to a backplane assembly consisting of a motherboard 2 and one or more daughterboards 10, but this connector assembly can also be employed in a manner such that the impedance of the signals transmitted through the connector assembly will match the impedance of the component with which the backplane assembly is used. For example, the preferred embodiment of this invention is intended for use in a backplane connector assembly in which a controlled impedance of 75 ohms is required.

The individual components of this connector assembly will now be described individually in more detail.

Motherboard Backplane Connector (Signal Section)

The motherboard backplane connector 100 has a plurality of signal contacts 104 and a ground plane contact or ground bus 106, each mounted in an insulative housing 102 formed from a material such as Ryton. The insulative housing 102 has a base 108 through which both the signal contacts 104 and the ground bus 106 extend and a lateral upwardly extending wall 110 which forms a cavity 112 along the upper side of the motherboard backplane connector 100. Each signal contact 104 is in the form of a pin having an upper section 114 and a lower section 116. The lower section 116 of each signal pin 104 includes a spring contact 118 adapted to make interconnection with a plated through hole 4 in the printed circuit motherboard 2. It should be understood, however, that the lower portion 116 of the signal contacts 104 can have other configurations, such as a conventional solder pin configuration. The lower portion 116 of each signal pin contact 104 has barbs 120 for securing the signal contact pin 104 in the lower base 108 of the insulative housing 102 of the motherboard backplane connector 100. The lower section 116 of each signal pin contact 104 is offset from the upper pin section 114 by a central dogleg 122, which is located at the top of the base 108. Since the upper pin section 114 and the lower pin section 116 can extend from the dogleg 122 at different points, the signal contact pins 104 can be formed so that the upper sections 114 are in line whereas the lower pin sections 116 are offset or staggered.

Four rows of lower contact pins 116 are formed with the lower pin sections 116 in adjacent rows being mutually spaced apart by a distance of 0.100 inch. The upper contact pin sections 114 are all spaced in a single row with a spacing of 0.050 inch. Thus, the upper contact pin sections 114 can be closely spaced whereas the lower section 116 can be spaced apart by a distance which makes the fabrication of traces on the printed circuit motherboard 2 easier.

The ground bus 106, positioned between inner and outer rows of signal contact pins 104, also has a plurality of depending legs 124 which are of the type suitable to form a spring contact with plated through holes 6 in a printed circuit motherboard 2. As with the signal contact pins 104, these spring contacts 126 on legs 124 can be replaced by a through hole solder pin configuration. The single ground bus 106 formed in the motherboard backplane connector 100 extends laterally along the length of the base 108 and extends upwardly into the cavity 112 formed on the upper side of the insulative housing 102.

Daughterboard Backplane Signal Connector

The daughterboard backplane signal connector 200 has a insulative housing 202 formed of a material such as Ryton and has a plurality of signal and ground contacts, 204 and 206 respectively, positioned therein. The signal contacts 204 each have a box type receptacle similar to the receptacle employed in the coaxial connector 400. The signal contacts 204 each have signal contact legs 210 extending at right angles with respect to the receptacle contact portion. Since the length of the upper portion of the signal pins 114 in the motherboard backplane connector 100 is longer for the rows on the outer portion of the ground plane bus 106 than for rows on the inner side of the ground plane 106, the receptacle contact portions are not located at the same height. The legs 210 extending from the receptacle portions of the daughterboard signal contacts are staggered in a similar configuration to the lower signal sections 116 of contacts 104 which establish interconnection to the traces on the motherboard 2.

Instead of a single continuous ground plane in the daughterboard signal connector 200, a plurality of ground blades 206 are located between the signal legs 210. Each blade 206 and corresponding receptacle has a central section 214 with a lower vertically extending segment or arm 216 which extends between receptacle portions of the signal contacts 204 in the outermost rows. This vertically extending arm of the blade has a bifurcated spring contact 218, located at its lower end, suitable for establishing a resilient contact with the base of the ground plane bus 106 in the motherboard connector 100.

Daughterboard Power Connector

Figure 2A:
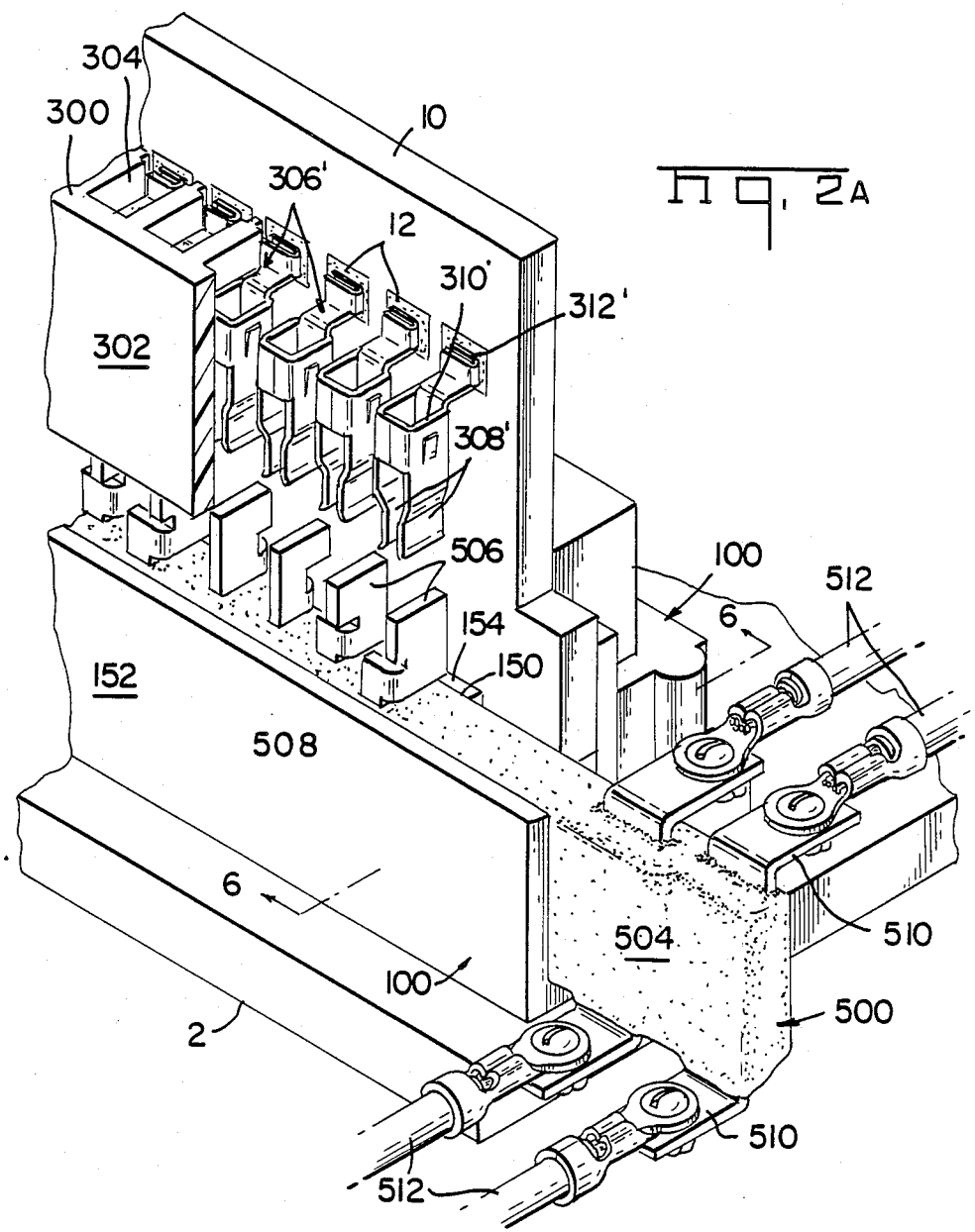
FIGS. 2A and 2B are perspective views showing the daughterboard power connector just prior to mating with the laminated power bus.
Figure 2B:
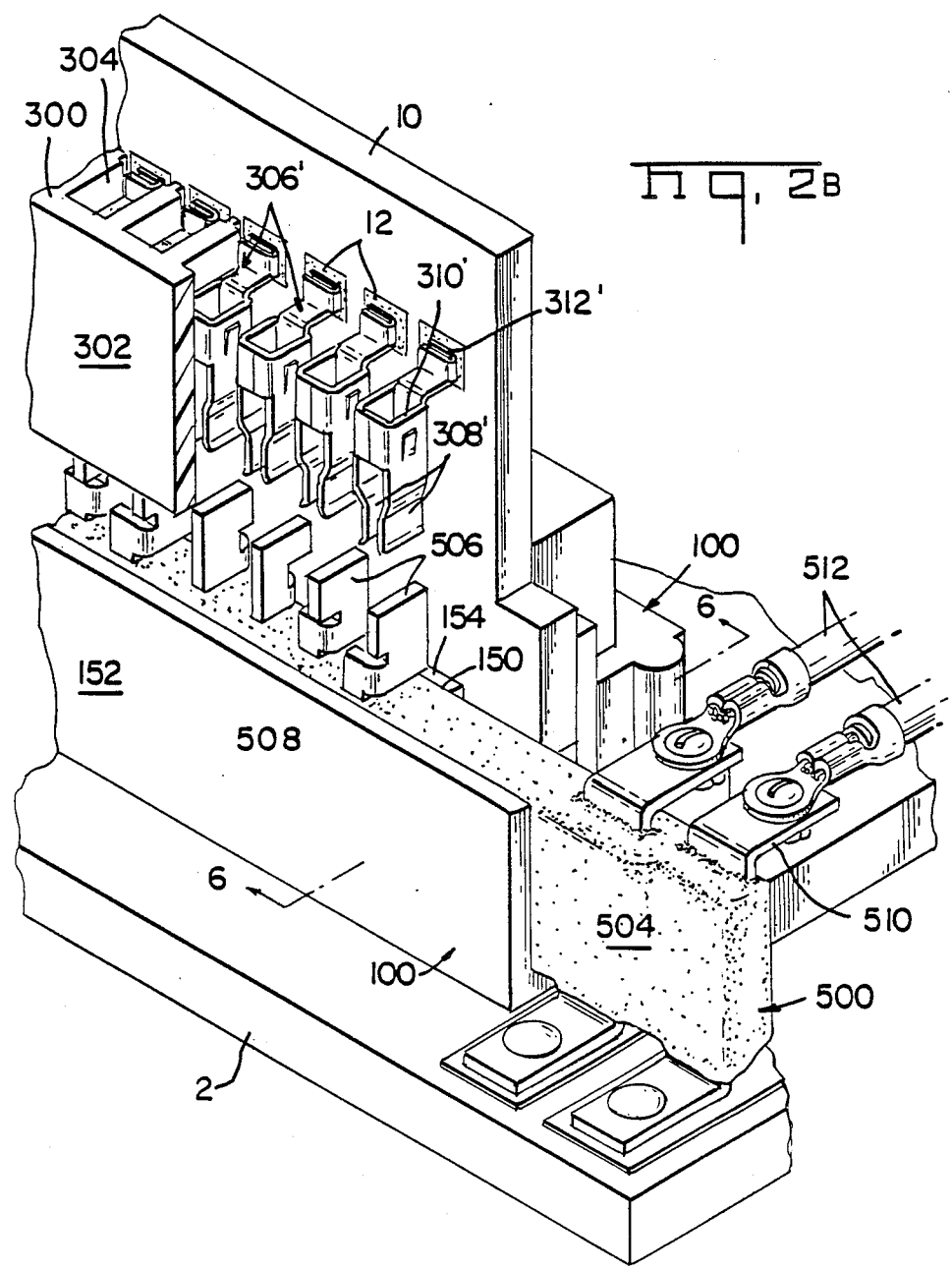
Figure 6:
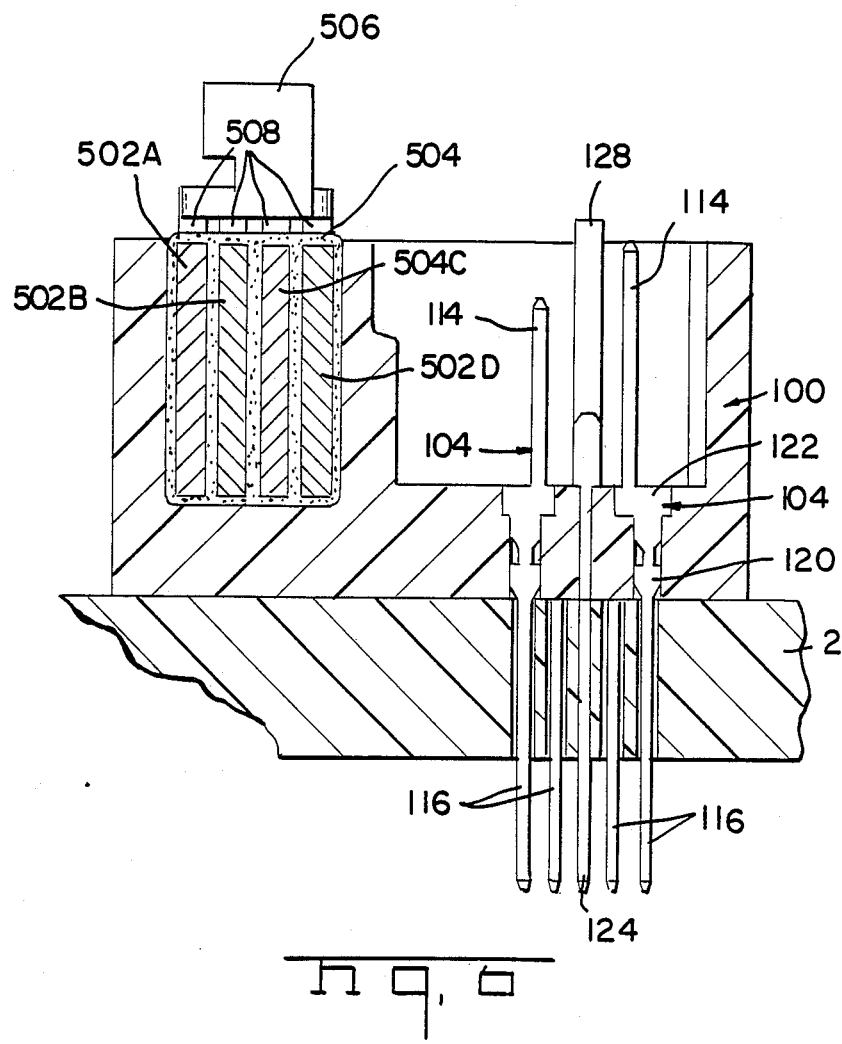
FIG. 6 is a sectional view of the bus bars in the housing.

The daughterboard power connector 300 is completely separate from the daughterboard signal connector 200. The daughterboard power connector 300 includes a housing 302 containing a plurality of side-by-side cavities 304, each of which receives a single daughterboard power contact 306 which is surface mounted to power traces in the daughterboard 10 through surface mount pads 12. The individual power contacts 306 in the daughterboard power connector 300 each have dual contact legs 308 or 308' extending downwardly and located at right angles relative to the daughterboard 10. Each leg 308 is resilient and is adapted to receive a single blade delivering power from the motherboard 2. Note that the width of the motherboard power blades is such that contact can still be established even though the motherboard power blades are mated at different lateral positions relative to the female daughterboard power contacts 306. Thus, the power configuration is not dependent upon the use of a daughterboard 10 having a specified thickness. The resilient spring legs 308 of FIG. 1 in the daughterboard receptacle contacts 306 project downwardly from a box section 310 in the stamped and formed power contact 306. A surface mount foot 312 having a reversely bent configuration extends orthogonally relative to the box section 310 to establish contact with a surface mount power pad 12. The resilient spring legs 308' depicted in FIG. 2 comprise opposed cantilever members extending from a box section 310'.

Motherboard Backplane Connector (Power Section)

The power section of the housing of the motherboard backplane connector 100 comprises an integral portion thereof. A continuous channel 150 extends along the entire length of the motherboard backplane connector 100. This channel is formed by an outer wall 152 which comprises a portion of the housing of connector 100 and by a parallel inner wall 154 located adjacent the lower edge of the daughterboard 10. A laminated bus bar 500 is positioned within channel 150 between the wall 152 and the wall 154.

Laminated Power Bus

The laminated power bus 500 comprises a series of individual busses 502A-D contained within an insulative housing 504. Busses 502 each are fabricated from a conductive metal, such as a conventional copper alloy, which is electrically conductive. In the preferred embodiment of this invention, there are four busses, two delivering power at different voltages, while the other two are maintained at a ground potential. The four busses 502A-D are parallel and are all partially encapsulated within an insulating material of conventional formulation. This insulating material pots the portions of the busses which are partially encapsulated. Each of the busses 502 has a plurality of upwardly extending contact tabs 506 which is bent at right angles to the busses 502. In the preferred embodiment of this invention, the width of the tabs 506 is substantially equal to the width of the laminated power bus 500. The height of ground tabs can be greater than the height of the power tabs so that the ground tabs make first and break last. Each tab 506 extends across the other three busses such that the tabs 506 are located in a side-by-side configuration, with interconnecting portions 508 between each tab 506 and the respective bus 502 being staggered along the length of the ground bus 500. A notch separates a portion of each tab from the interconnecting portion. Each tab 506 will then be in position to mate with contacts 308 or 308' of a female daughterboard power contact. The tabs 506 will also be oriented at right angles to the daughterboard 10.

Each power bus 502 includes an integral leg 510 which comprises a means of attaching the respective bus 502 to an external conductor 512. In one embodiment depicted herein, the external conductors 512 comprise wires which are external to the motherboard 2. Thus, power traces need not be incorporated into the motherboard. In this embodiment depicted herein, the legs 510 have holes which permit the use of a screw down termination between the wires and the respective busses 502. It should be understood that other conventional external conductors and other conventional termination means could be easily employed, and that the bus bars can be attached directly to the motherboard as shown in this embodiment.

We claim:

1. A laminated bus bar comprising a plurality of elongate conductive bars, the bus bars being positioned side-by-side in parallel planes, adjacent bus bars being separated by insulative material to form a laminate configuration, each said bar having a plurality of tabs extending from one elongate edge, at least a portion of each said tab extending beyond the insulative material to form an electrical contact tab, the electrical contact tabs being parallel and oriented to engage a mating electrical recptacle along the one elongate edge from which the electrical contact tabs extend, the plane of each said electrical contact tab extending transversely relative to the longitudinal axis of the laminated bus bar.

2. The laminate bus bar of claim 1 wherein each said electrical contact tab overlaps at least some of the other said bars along the one elongate edge.

3. The laminated bus bar of claim 2 wherein the width of each said electrical contact tab is no greater than the thickness of the laminated bus bar.

4. The laminated bus bar of claim 2 wherein each said electrical contact tab is joined to the respective bar by an intermediate section in the plane of the bar, a notch being formed between the electrical contact tab and the remainder of the bar so that the electrical contact tab overlaps the intermediate section.

5. The laminated bus bar of claim 1 wherein the electrical contact tabs are evenly spaced along said one elongate edge of the laminated bus bar.

6. The laminated bus bar of claim 1 wherein each said bar includes a lug for attaching said bar to an external source of electric potential.

7. The laminated bus bar of claim 6 wherein each said lug extends orthogonally relative to the laminated bus bar and to the electrical contact tabs.

8. The laminated bus bar of claim 7 wherein at least one lug extends from an edge opposite from said elongate edge from which said electrical contact tabs extend.

9. The laminated bus bar of claim 1 wherein said electrical contact tabs are oriented to engage a plurality of mating electrical receptacles in a mating electrical connector.

10. The laminated bus bar of claim 9 wherein the height of some of the electrical contact tabs exceeds the height of others of the electrical contact tabs so that the electrical contact tabs having the greater height are adapted to make contact with mating electrical receptacles first during mating and break contact last during unmating.

11. A backplane assembly comprising a motherboard and a plurality of daughterboards, the improvement comprising laminated bus bar means for delivering current to the daughterboards, the laminated bus bar means including a plurality of elongate conductive bus bars separated by insulative material, each of said bars having at least one electrical contact tab extending therefrom, and an electrical connector on each said daughterboard having a plurality of mating terminals each mating with one of the electrical contact tabs on the laminated bus bar means so that current can be delivered to the daughterboards through the laminated bus bar means.

12. The backplane assembly of claim 11 wherein each said electrical contact tab comprises an integral portion of one bus bar extending from one elongate edge of the laminated bus bar means, each said electrical contact tab being orthogonal to and overlapping the one elongate edge of the laminated bus bar means, said mating terminals comprising receptacles engagable with said electrical contact tabs, each electrical contact tab extending transversely relative to the longitudinal axis of the laminated bus bar means.

13. The backplane assembly of claim 11 wherein the conductive bus bars deliver current to individual daughterboards at different voltages.

14. The backplane assembly of claim 11 wherein the laminated bus bar means comprises means for delivering electrical power to a said daughterboard.

15. The backplane assembly of claim 14 wherein the laminated bus bar means includes at least one ground bar and at least one power bar.

16. The backplane assembly of claim 11 wherein the laminated bus bar means is disposed within a housing on the motherboard.

17. The backplane assembly of claim 11 wherein the laminated bus bar means comprises means for delivering electrical power to the daughterboards, the backplane assembly further including signal terminals for transmitting signals between the motherboard and the daughterboards.

18. The backplane assembly of claim 11 wherein said electrical contact tabs on the laminated bus bar means are spaced apart so that electric current can delivered at substantially the same potential to different points on each daughterboard.

19. The backplane assembly of claim 11 wherein the laminated bus bar means is electrically connected to the daughterboards to deliver current to the daughterboards independently of the motherboard.

20. The backplane assembly of claim 11 wherein the laminated bus bar means is electrically connected to the motherboard and at least one daughterboard.

* * * * *